United States Patent
Shima

(10) Patent No.: US 8,072,031 B2
(45) Date of Patent: Dec. 6, 2011

(54) P-CHANNEL MOS TRANSISTOR AND SEMICONDUCTOR INTEGRATED CIRCUIT DEVICE

(75) Inventor: Masashi Shima, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 354 days.

(21) Appl. No.: 12/176,616

(22) Filed: Jul. 21, 2008

(65) Prior Publication Data

US 2008/0277732 A1 Nov. 13, 2008

Related U.S. Application Data

(63) Continuation of application No. PCT/JP2006/302173, filed on Feb. 8, 2006.

(51) Int. Cl.
*H01L 21/70* (2006.01)
(52) U.S. Cl. ........... 257/368; 257/E21.43; 257/E21.634; 257/E21.64
(58) Field of Classification Search .................. 257/368, 257/E21.43, E21.634, E21.64
See application file for complete search history.

(56) References Cited

U.S. PATENT DOCUMENTS

| | | | |
|---|---|---|---|
| 5,955,770 A * | 9/1999 | Chan et al. | 257/408 |
| 6,982,465 B2 | 1/2006 | Kumagai et al. | |
| 7,115,954 B2 | 10/2006 | Shimizu et al. | |
| 2002/0137269 A1 * | 9/2002 | Ping et al. | 438/197 |
| 2004/0262683 A1 | 12/2004 | Bohr et al. | |
| 2005/0266631 A1 | 12/2005 | Kim et al. | |
| 2006/0006420 A1 * | 1/2006 | Goto | 257/204 |
| 2007/0034945 A1 | 2/2007 | Bohr et al. | |

FOREIGN PATENT DOCUMENTS

| | | |
|---|---|---|
| CN | 1577890 A | 2/2005 |
| JP | 62-259465 A | 11/1987 |
| JP | 2003-086708 A | 3/2003 |
| JP | 2006-13428 A | 1/2006 |
| JP | 2006-024784 A | 1/2006 |
| WO | 02-43151 A1 | 5/2002 |

OTHER PUBLICATIONS

S. Pidin et al.; "A Novel Strain Enhanced CMOS Architecture Using Selectively Deposited High Tensile and High Compressive Silicon Nitride Films"; IEDM, pp. 213-216, 2004.

(Continued)

*Primary Examiner* — Bradley K Smith
*Assistant Examiner* — Amar Movva
(74) *Attorney, Agent, or Firm* — Westerman, Hattori, Daniels & Adrian, LLP

(57) ABSTRACT

A p-channel MOS transistor includes a gate electrode formed on a silicon substrate via a gate insulating film, a channel region formed below the gate electrode within the silicon substrate, and a p-type source region and a p-type drain region formed at opposite sides of the channel region within the silicon substrate. In the p-channel MOS transistor, first and second sidewall insulating films are arranged on opposing sidewall faces of the gate electrode. First and second p-type epitaxial regions are respectively formed at outer sides of the first and second sidewall insulating films on the silicon substrate, and the first and second p-type epitaxial regions are arranged to be higher than the gate electrode. A stress film that stores tensile stress and covers the gate electrode via the first and second sidewall insulating films is continuously arranged over the first and second p-type epitaxial regions.

6 Claims, 14 Drawing Sheets

OTHER PUBLICATIONS

K. Mistry et al.; "Delaying Forever: Uniaxial Strained Silicon Transistors in a 90nm CMOS Technology"; Symposium on VLSI Technology Digest of Technical Papers, IEEE, pp. 50-51, 2004.

Kah Wee Ang et al.; "Enhanced Performance in 50 nm N-MOSFETs with Silicon-Carbon Source/Drain Regions"; IEDM, pp. 1069-1072, 2004.

A. Shimizu et al.; "Local Mechanical-Stress Control (LMC): A New Technique for CMOS-Performance Enhancement"; IEDM Technical Digest, p. 433, 2001.

Y. Nakahara et al.; "A Robust 65-nm Node CMSO Technology for Wide-range Vdd Operation"; IEDM Technical Digest, p. 281, 2003.

Chien-Hao Chen et al.; "Stress Memorization Technique (SMT) by Selectively Strained-Nitride Capping for Sub-65nm High-Performance Strained-Si Device Application"; 2004 Symposium on VLSI Technology Digest of Technical Papers, IEEE, pp. 56-57.

A. Oishi et al.; "High Performance CMOSFET Technology for 45nm Generation and Scalability of Stress-Induced Mobility Enhancement Technique"; IEDM, 2005, pp. 229-232.

K. Ota et al.; "Stress Controlled Shallow Trench Isolation Technology to Suppress the Novel Anti-Isotropic Impurity Diffusion for 45nm-node High-Performance CMOSFETs", 2005 Symposium on VLSI Technology Digest of Technical Papers; pp. 138-139.

International Search Report of PCT/JP2006/302173, date of mailing May 16, 2006.

T. Ghani et al.; "A Novel High Volume Manufacturing Logic Technology Featuring Novel 45nm Gate Length Strained Silicon CMOS Transistors", IEDM 2003, pp. 978-980, Jun. 10, 2003.

Chinese Office Action dated Aug. 14, 2009, issued in corresponding Chinese Patent Application No. 2006800525357.

\* cited by examiner

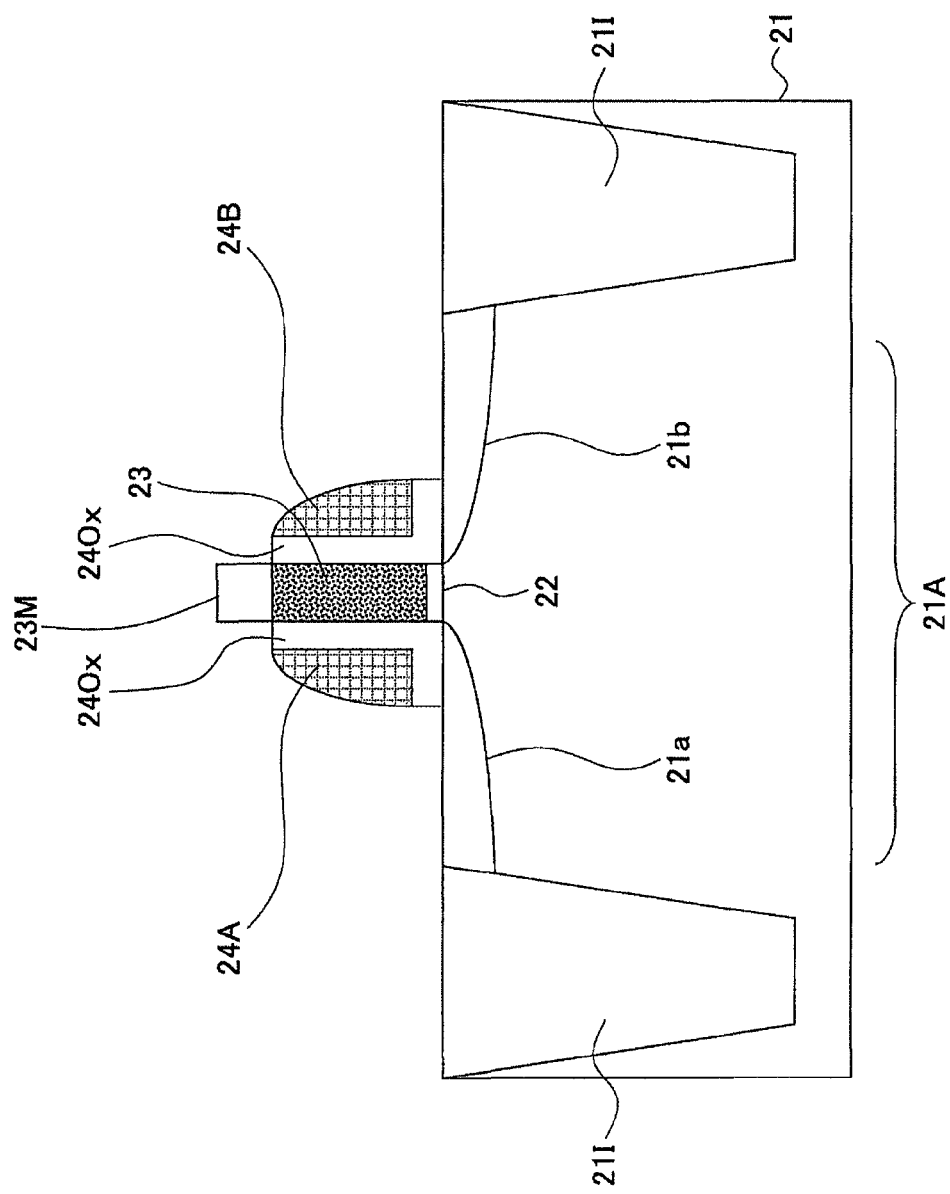

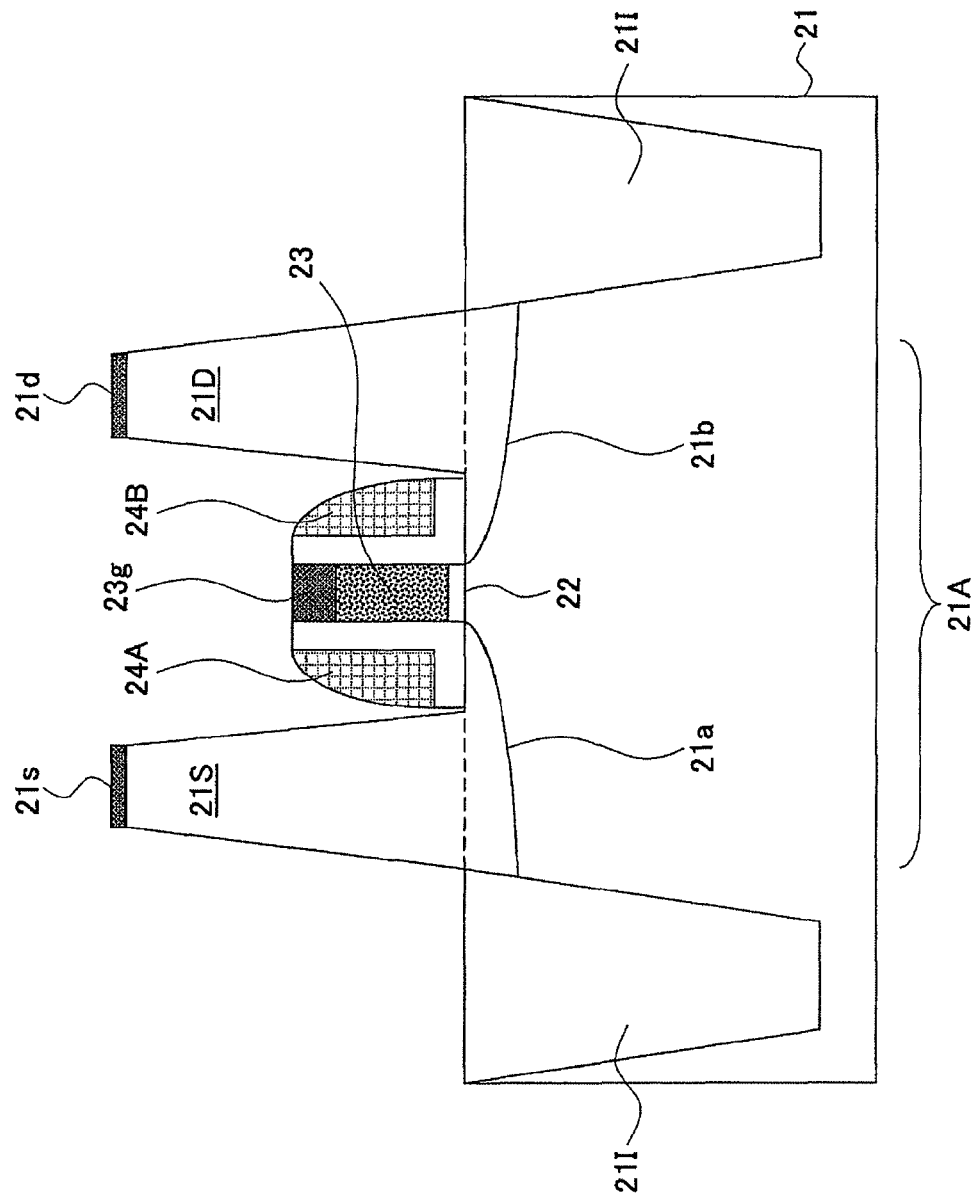

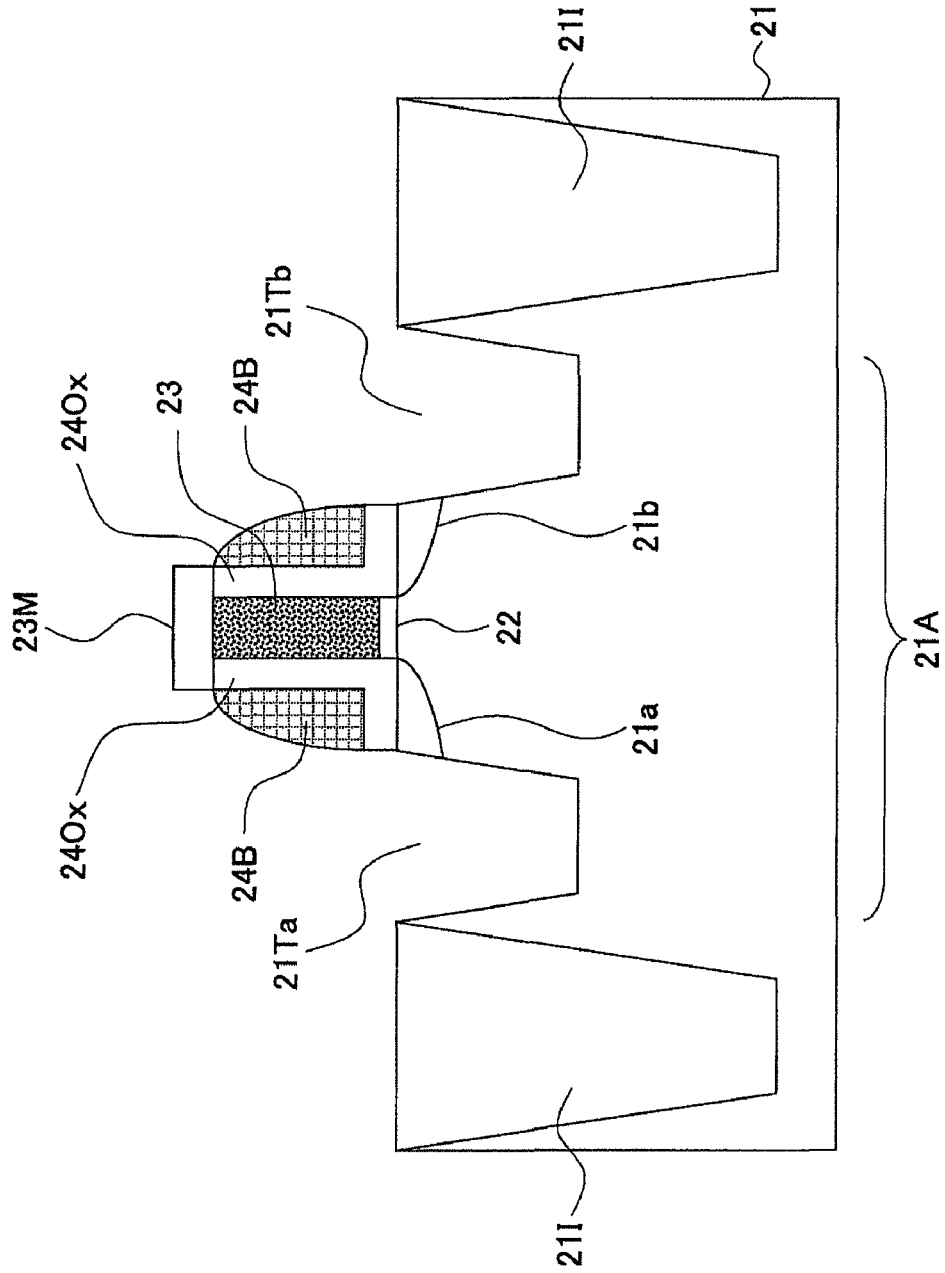

P-CHANNEL MOS TRANSISTOR AND SEMICONDUCTOR INTEGRATED CIRCUIT DEVICE

CROSS REFERENCE TO RELATED APPLICATIONS

This application is a U.S. continuation application filed under 35 USC 111(a) claiming benefit under 35 USC 120 and 365(c) of PCT application JP2006/302173, filed on Feb. 8, 2006, the entire contents of which are hereby incorporated by reference.

BACKGROUND OF THE INVENTION

1. Field of the Invention

The present invention relates to a p-channel MOS transistor that is strained to improve operation speed and a semiconductor integrated circuit device including such a p-channel MOS transistor.

2. Description of the Related Art

Owing to the development of micro-fabrication technology, presently, a super miniaturized super high-speed semiconductor device having a gate length less than 100 nm can be fabricated.

In such a super miniaturized super high-speed transistor, the area of a channel region right below a gate electrode is significantly smaller than that of a conventional semiconductor device so that electron mobility or hole mobility at such a channel region may be greatly influenced by stress applied to this channel region. Accordingly, techniques have been proposed for optimizing the stress applied to such a channel region to improve the operation speed of a semiconductor device.

FIGS. 1A and 1B are diagrams respectively illustrating ideal stress distributions for improving the operation speed of an n-channel MOS transistor and a p-channel MOS transistor according to Ota, K., et al. (see below Non-Patent Reference 7).

In the n-channel MOS transistor shown in FIG. 1A, an n-type polysilicon gate electrode 3N is arranged across a device region 1N, and the device region 1N is divided into an n-type source region S and an n-type drain region D by the polysilicon gate electrode 3N.

Similarly, in the p-channel MOS transistor shown in FIG. 1B, a p-type polysilicon gate electrode 3P is arranged across a device region 1P, and the device region 1P is divided into a p-type source region S and a p-type drain region D by the polysilicon gate electrode 3P.

In the n-channel MOS transistor of FIG. 1A, electron mobility at the channel region located right below the gate electrode 3N may be increased and the transistor operation speed may be improved when tensile stress (in-plane tensile stress) is applied in the gate width directions and the gate length directions. In the p-channel MOS transistor of FIG. 1B, hole mobility at the channel region located right below the gate electrode 3P may be increased and the transistor operation speed may be improved when tensile stress is applied in the gate width directions and compression stress (uniaxial compression stress) is applied in the gate length directions.

FIG. 2A is a diagram showing one exemplary n-channel MOS transistor structure according to the prior art that has been proposed for inducing tensile stress acting in the gate length directions as shown in FIG. 1A at the channel region right below the gate electrode 3N.

In the n-channel MOS transistor shown in FIG. 2A, a device region 1N is defined within a silicon substrate 1, and an $n^+$-type polysilicon gate electrode 3N is formed on the silicon substrate 1 within this device region 1N via a gate insulating film 2N. Also, an n-type source extension region 1$a$N and an n-type drain extension region 1$b$N are formed at the sides of the polysilicon gate electrode 3N within the portion of the silicon substrate 1 corresponding to the device region 1N.

Also, sidewall insulating films 4$n$N made of SiN are formed on the sidewalls of the polysilicon gate electrode 3N via sidewall oxide films 4$o$N, and an $n^+$-type source region 1$c$N and an $n^+$-type drain region 1$d$N are formed at side portions of the silicon substrate 1 located further outward from the sidewall insulating films 4$n$N.

Also, silicide films 5SN, 5DN, and 5GN are formed on the $n^+$-type source region 1$c$N, the $n^+$-type drain region 1$d$N, and the $n^+$-type polysilicon gate electrode 3N, respectively. Additionally, a SiN film 6N that stores tensile stress is arranged on the silicon substrate 1 to cover the silicide films 5SN, 5DN, 5GN and the sidewall insulating films 4$n$N.

The tensile stress stored in the SiN film 6N acts to push the gate electrode 3N toward the silicon substrate 1 in a direction perpendicular to the substrate surface. As a result, strain is induced at the channel region right below the gate electrode 3N which strain is similar to the strain induced when tensile stress is applied in the gate length directions as is shown in FIG. 1A.

FIG. 2B is a diagram showing an exemplary p-channel MOS transistor structure disclosed in Pidin, S., et al. (see below Non Patent Reference 6) for inducing compression stress acting in the gate length directions as shown in FIG. 1B at a channel region right below a gate electrode.

In the p-channel MOS transistor shown in FIG. 2B, a device region 1P is defined on a silicon substrate 1, and an $p^+$-type polysilicon gate electrode 3P is formed on this device region 1P via a gate insulating film 2P. Also, a p-type source extension region 1$a$P and a p-type drain extension region 1$b$P are formed at the sides of the polysilicon gate electrode 3P within the portion of the silicon substrate 1 corresponding to the device region 1P.

Also, sidewall insulating films 4$n$P made of SiN are formed on the sidewalls of the polysilicon gate electrode 3P via sidewall oxide films 4$o$P, and an $n^+$-type source region 1$c$P and an $n^+$-type drain region 1$d$P are formed at side portions of the silicon substrate 1 located further outward from the sidewall insulating films 4$n$P.

Also, silicide films 5SP, 5DP, and 5GP are formed on the $n^+$-type source region 1$c$P, the $n^+$-type drain region 1$d$P, and the $n^+$-type polysilicon gate electrode 3P, respectively. Additionally, a SiN film 6$a$P that stores compression stress is arranged on the silicon substrate 1 to extend over the silicide films 5SP, 5DP, 5GP and the sidewall insulating films 4$n$P.

The compression stress stored in the SiN film 6P acts to pull the gate electrode 3P away from the silicon substrate 1 in a direction perpendicular to the substrate surface. As a result, strain is induced at the channel region right below the gate electrode 3P which strain is similar to the strain induced when compression stress is applied in the gate length directions as is shown in FIG. 1B.

However, when the n-channel MOS transistor and the p-channel MOS transistor as shown in FIGS. 2A and 2B are fabricated on the same substrate to create a CMOS device, for example, the tensile stress film 6N and the compression stress film 6P have to be separately fabricated so that the fabrication process may become complicated.

[Patent Reference 1]: Japanese Laid-Open Patent Publication No. 2003-86708

[Patent Reference 2]: WO2002/043151
[Non-Patent Reference 1]: Shimizu, A., et al., IEDM Technical Digest, p. 433, 2001
[Non-Patent Reference 2]: Nakahara, Y., et al., IEDM Technical Digest, p. 281, 2003
[Non-Patent Reference 3]: Chen, C., et al., 2004 Symposium on VLSI Technology Digest of Technical Papers, pp. 56-57
[Non-Patent Reference 4]: Ghani, T., et al., IEDM 2003, pp. 978-980, Jun. 10, 2003
[Non-Patent Reference 5]: Oishi, A., et al., IEDM 2005, pp. 229-232
[Non-Patent Reference 6]: Pidin, S., et al., IEDM Technical Digest p. 213, 2004
[Non-Patent Reference 7]: Ota, K., et al., 2005 Symposium on VLSI Technology Digest of Technical Papers pp. 138-139

SUMMARY OF THE INVENTION

According to one embodiment of the present invention, a p-channel MOS transistor is provided that includes:
a silicon substrate;
a gate electrode formed on the silicon substrate via a gate insulating film;
a channel region formed below the gate electrode within the silicon substrate;
a p-type source region and a p-type drain region that are formed at opposite sides of the channel region within the silicon substrate;
a first sidewall insulating film and a second sidewall insulating film that are formed on opposing sidewall faces of the gate electrode;
a first p-type epitaxial region and a second p-type epitaxial region that are respectively formed at the outer sides of the first sidewall insulating film and the second sidewall insulating film on the silicon substrate and are arranged to be higher than the gate electrode; and
a tensile stress film that stores tensile stress and is arranged to cover the gate electrode via the first sidewall insulating film and the second sidewall insulating film, the tensile stress film being continuously arranged over the first p-type epitaxial region and the second p-type epitaxial region.

According to another embodiment of the present invention, a semiconductor device is provided that includes:
a silicon substrate having a first device region and a second device region;
an n-channel MOS transistor that is formed at the first device region; and
a p-channel MOS transistor that is formed at the second device region;
wherein the n-channel MOS transistor includes
a first gate electrode that is formed on the silicon substrate at the first device region via a first gate insulating film and is defined by a first sidewall face and a second sidewall face opposing each other;
a first n-type diffusion region and a second n-type diffusion region respectively formed at the outer sides of the first sidewall face and the second sidewall face of the first gate electrode within the silicon substrate;
a first sidewall insulating film and a second sidewall insulating film respectively arranged on the first sidewall face and the second sidewall face of the first gate electrode;
a third n-type diffusion region formed at the outer side of the first sidewall insulating film within the silicon substrate; and
a fourth n-type diffusion region formed at the outer side of the second sidewall insulating film within the silicon substrate;
wherein the p-channel MOS transistor includes
a second gate electrode that is formed on the silicon substrate at the second device region via a second gate insulating film and is defined by a third sidewall face and a fourth sidewall face opposing each other;
a first p-type diffusion region and a second p-type diffusion region respectively formed at the outer sides of the third sidewall face and the fourth sidewall face of the second gate electrode within the silicon substrate;
a third sidewall insulating film and a fourth sidewall insulating film respectively arranged on the third sidewall face and the fourth sidewall face of the second gate electrode;
a first p-type epitaxial region that is formed at the outer side of the third sidewall insulating film on the silicon substrate and is arranged to be higher than the second gate electrode; and
a second p-type epitaxial region that is formed at the outer side of the fourth sidewall insulating film on the silicon substrate and is arranged to be higher than the second gate electrode; and
wherein a tensile stress film that stores tensile stress is continuously arranged on the silicon substrate to extend over the first device region and the second device region, the tensile stress film at the first device region being arranged to cover the third n-type diffusion region, the fourth n-type diffusion region, the first sidewall insulating film, and the second sidewall insulating film, and the tensile stress film at the second device region being arranged to cover the third sidewall insulating film, the fourth sidewall insulating film, the first p-type epitaxial region, and the second p-type epitaxial region.

According to another embodiment of the present invention, a semiconductor device is provided that includes:
a silicon substrate having a first device region and a second device region;
a p-channel MOS transistor that is formed at the first device region; and
an n-channel MOS transistor that is formed at the second device region;
wherein the p-channel MOS transistor includes
a first gate electrode that is formed on the silicon substrate at the first device region via a first gate insulating film and is defined by a first sidewall face and a second sidewall face opposing each other;
a first p-type diffusion region and a second p-type diffusion region respectively formed at the outer sides of the first sidewall face and the second sidewall face of the first gate electrode within the silicon substrate;
a first sidewall insulating film and a second sidewall insulating film respectively arranged on the first sidewall face and the second sidewall face of the first gate electrode;
a third p-type diffusion region formed at the outer side of the first sidewall insulating film within the silicon substrate; and
a fourth p-type diffusion region formed at the outer side of the second sidewall insulating film within the silicon substrate;
wherein the n-channel MOS transistor includes
a second gate electrode that is formed on the silicon substrate at the second device region via a second gate insulating film and is defined by a third sidewall face and a fourth sidewall face opposing each other;
a first n-type diffusion region and a second n-type diffusion region respectively formed at the outer sides of the third sidewall face and the fourth sidewall face of the second gate electrode within the silicon substrate;

a third sidewall insulating film and a fourth sidewall insulating film respectively arranged on the third sidewall face and the fourth sidewall face of the second gate electrode;

a first n-type epitaxial region that is formed at the outer side of the third sidewall insulating film on the silicon substrate and is arranged to be higher than the second gate electrode; and a second n-type epitaxial region that is formed at the outer side of the fourth sidewall insulating film on the silicon substrate and is arranged to be higher than the second gate electrode; and wherein a compression stress film that stores compression stress is continuously arranged on the silicon substrate to extend over the first device region and the second device region, the compression stress film at the first device region being arranged to cover the third p-type diffusion region, the fourth p-type diffusion region, the first sidewall insulating film, and the second sidewall insulating film, and the compression stress film at the second device region being arranged to cover the third sidewall insulating film, the fourth sidewall insulating film, the first n-type epitaxial region, and the second n-type epitaxial region.

BRIEF DESCRIPTION OF THE DRAWINGS

FIG. 4B is a diagram illustrating a subsequent process step continued from the process step of FIG. 4A for fabricating the p-channel MOS transistor of FIG. 3;

FIG. 4D is a diagram illustrating a subsequent process step continued from the process step of FIG. 4C for fabricating the p-channel MOS transistor of FIG. 3;

FIG. 7A is a diagram illustrating a process step for fabricating the p-channel MOS transistor of FIG. 6;

DESCRIPTION OF THE PREFERRED EMBODIMENTS

In the following, preferred embodiments of the present invention are described with reference to the accompanying drawings.

First Embodiment

Figure 3:
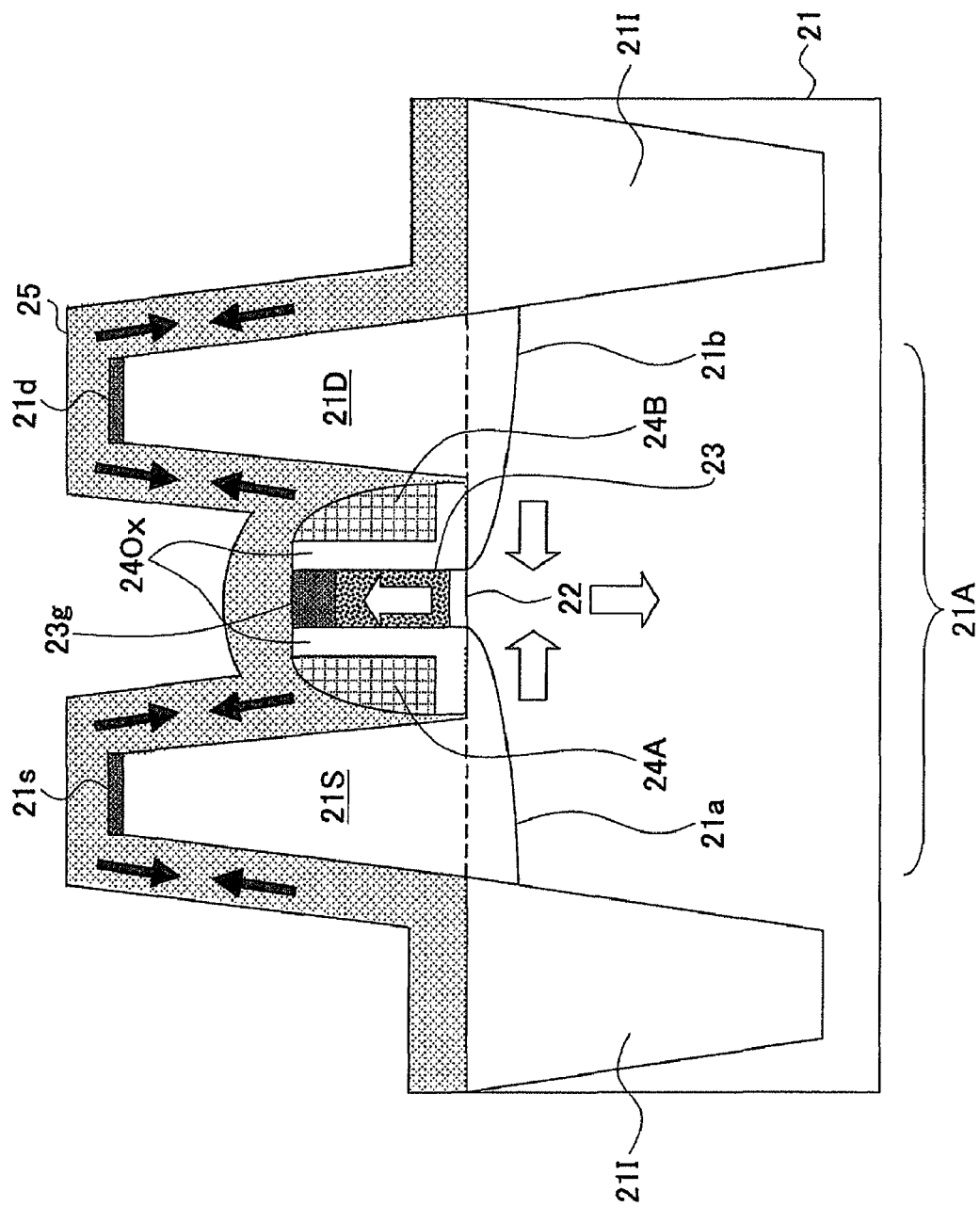
FIG. 3 is a diagram showing a configuration of a p-channel MOS transistor according to a first embodiment of the present invention.

FIG. 3 is a diagram showing a configuration of a p-channel MOS transistor 20 according to a first embodiment of the present invention.

As is shown in FIG. 3, the p-channel MOS transistor 20 is fabricated on a silicon substrate 21 at a device region 21A that is defined by a STI device isolating structure 21I. The p-channel MOS transistor 20 includes a gate insulating film 22 that is typically made of SiON and a $p^+$-type polysilicon gate electrode 23 that is formed on the gate insulating film 22 and has a gate length of 30 nm and a height of 30-120 nm, for example. It is noted that a p-type source extension region 21a and a p-type drain extension region 21b are respectively formed at a first side and a second side of the gate electrode 23 within the silicon substrate 21 that corresponds to the device region 21A.

Also, sidewall insulating films 24A and 24B made of SiN are respectively formed on first and second sidewall faces of the gate electrode 23 via sidewall oxide films 24Ox, and Si regions 21S and 21D that are made of Si epitaxial layers are respectively arranged at the outer sides of the sidewall insulating layers 24A and 24B on the silicon substrate 1 within the device region 21A. It is noted that the Si regions 21S and 21D are arranged to be higher than the gate electrode 23 and may be arranged at a height of 40-150 nm, for example. The Si epitaxial layers 21S and 21D are doped with a p-type dopant to function as a source region and a drain region of the p-channel MOS transistor 20. Further, low-resistance silicide layers 21s and 21d that are made of NiSi or $CoSi_2$ are respectively formed on the Si epitaxial layers 21S and 21D, and a low-resistance silicide layer 23g is formed on the polysilicon gate electrode 23.

In the p-channel MOS transistor 20 of FIG. 3, a SiN film 25 that stores a tensile stress of approximately 0.4-4.0 GPa, for example, is arranged on the silicon substrate 21 to cover the Si epitaxial layers 21S and 21D, and this SiN film 25 is arranged to extend continuously over the gate electrode 23 via the sidewall insulating films 24A and 24B.

Figure 2A:
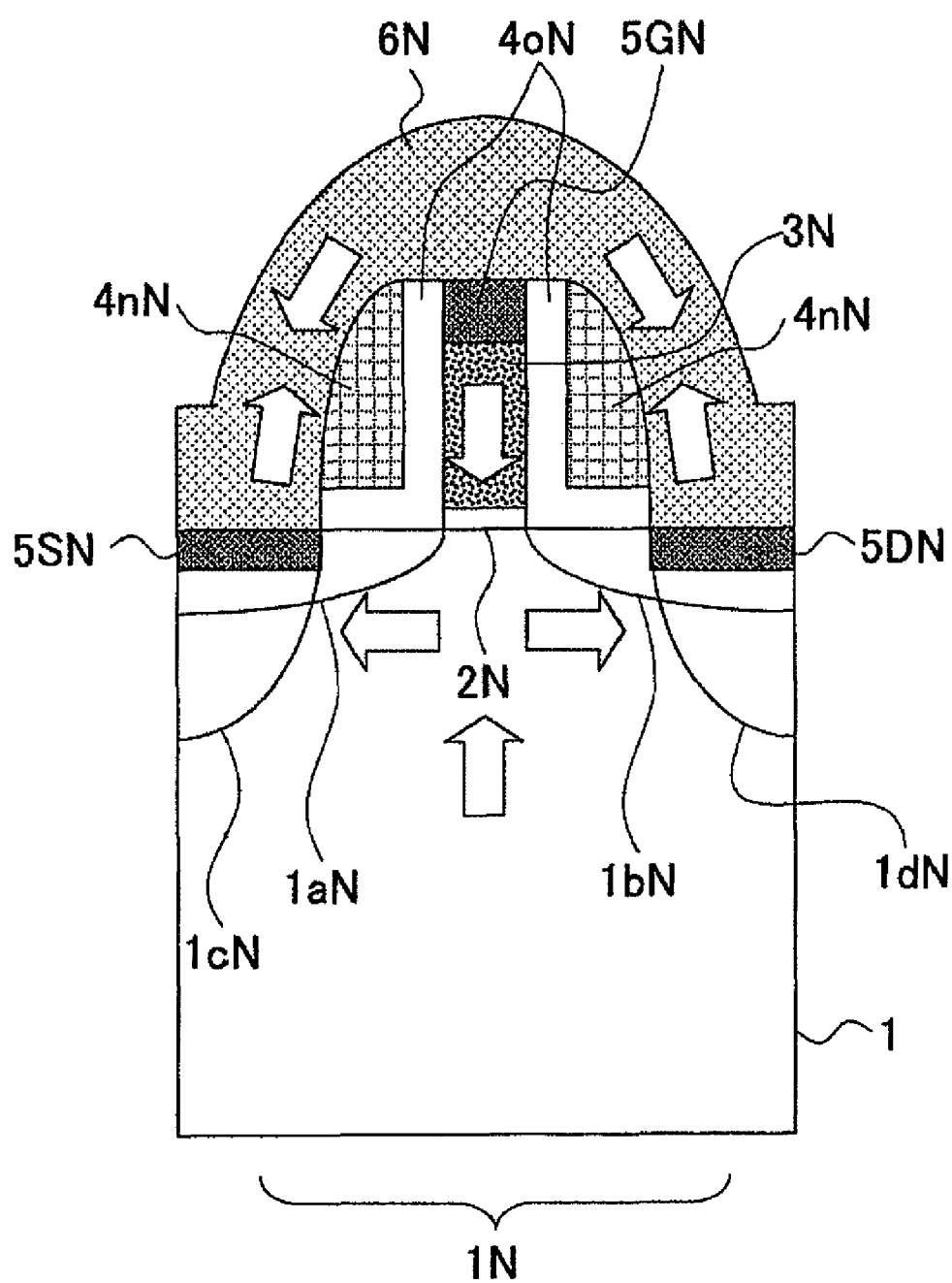
FIG. 2A is a diagram showing a configuration of a strained n-channel MOS transistor according to the related art.
Figure 2B:
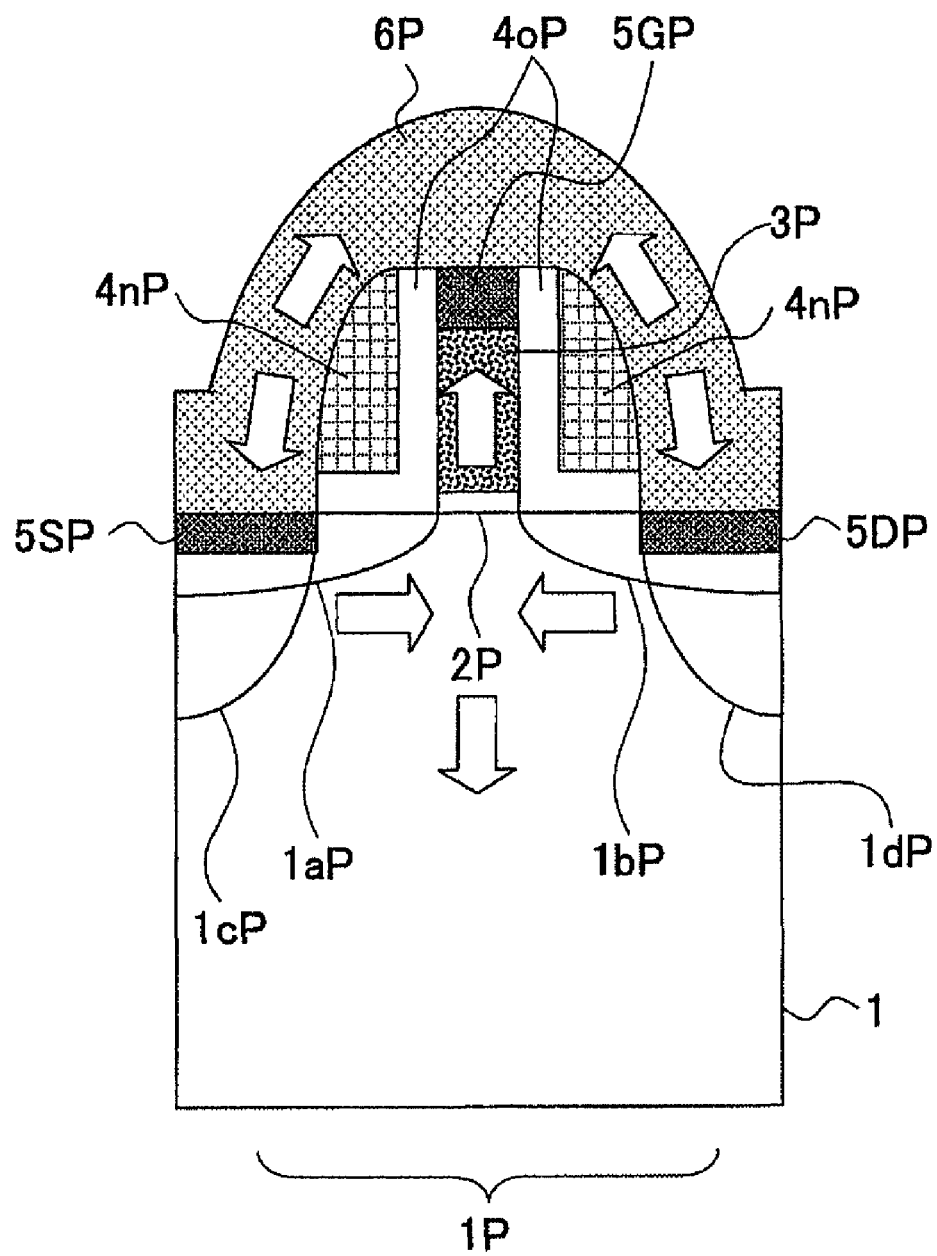
FIG. 2B is a diagram showing a configuration of a strained p-channel MOS transistor according to the related art.

By arranging the p-channel MOS transistor 20 to have the above-described configuration, the portion of the tensile stress SiN film 25 covering the Si epitaxial layers 21S and 21D may act to pull the gate electrode 23 upward from the substrate surface via the sidewall insulating films 24A and 24B. That is, in the present embodiment, uniaxial compression stress similar to that generated in FIG. 2B using the compression stress SiN film 6P may be induced at the channel region right below the gate electrode 23 using the tensile stress SiN film 25.

FIGS. 4A-4D are diagrams illustrating process steps for fabricating the p-channel MOS transistor shown in FIG. 3.

Figure 4A:
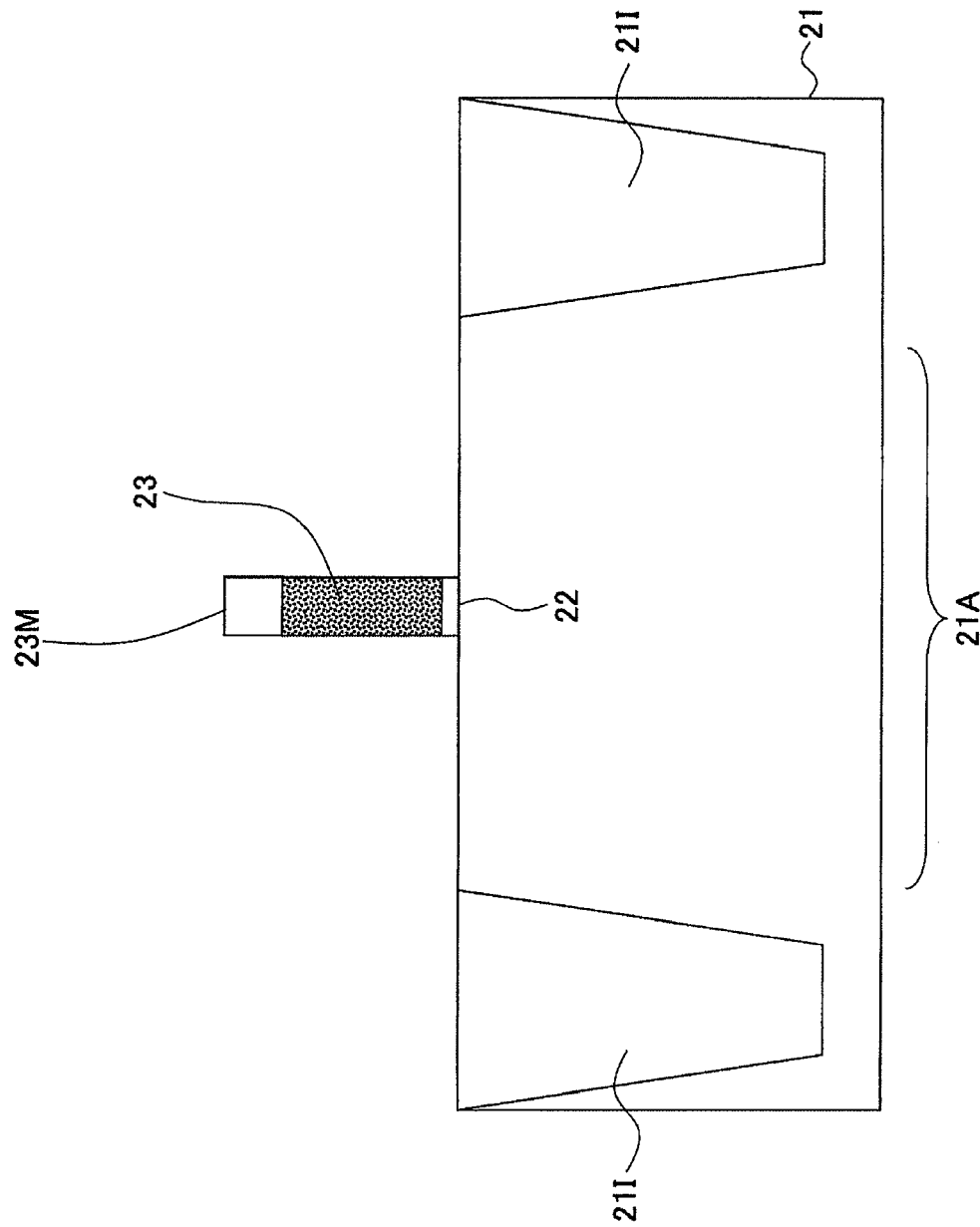
FIG. 4A is a diagram illustrating a process step for fabricating the p-channel MOS transistor of FIG. 3.

As is shown in FIG. 4A, after defining the device region 21A on the silicon substrate 21 by the STI device isolation structure 21I, a polysilicon film having a thickness of 30-120 nm is deposited on the silicon substrate 21 via a SiON film that forms the gate insulating film 22. Then, the polysilicon film is patterned using a silicon oxide film 23M as a hard mask to create the polysilicon gate electrode 23.

Then, in the process step shown in FIG. 4B, the polysilicon gate electrode 23 is used as a mask to introduce a p-type impurity element such as boron (B) into the silicon substrate 21 through ion implantation so that p-type diffusion regions 21a and 21b respectively corresponding to a source extension region and a drain extension region are formed at the first and second sides of the gate electrode 23.

Also, in the process step of FIG. 4B, after creating the diffusion regions 21a and 21b, the sidewalls of the gate electrode 23 are covered by the sidewall oxide films 24Ox corresponding to CVD oxide films, and the SiN sidewall insulating films 24A and 24B are formed on the outer sides of the sidewall oxide films 24Ox. It is noted that in this process, the silicon oxide film hard mask pattern 23M is left on the gate electrode 23.

Figure 4C:
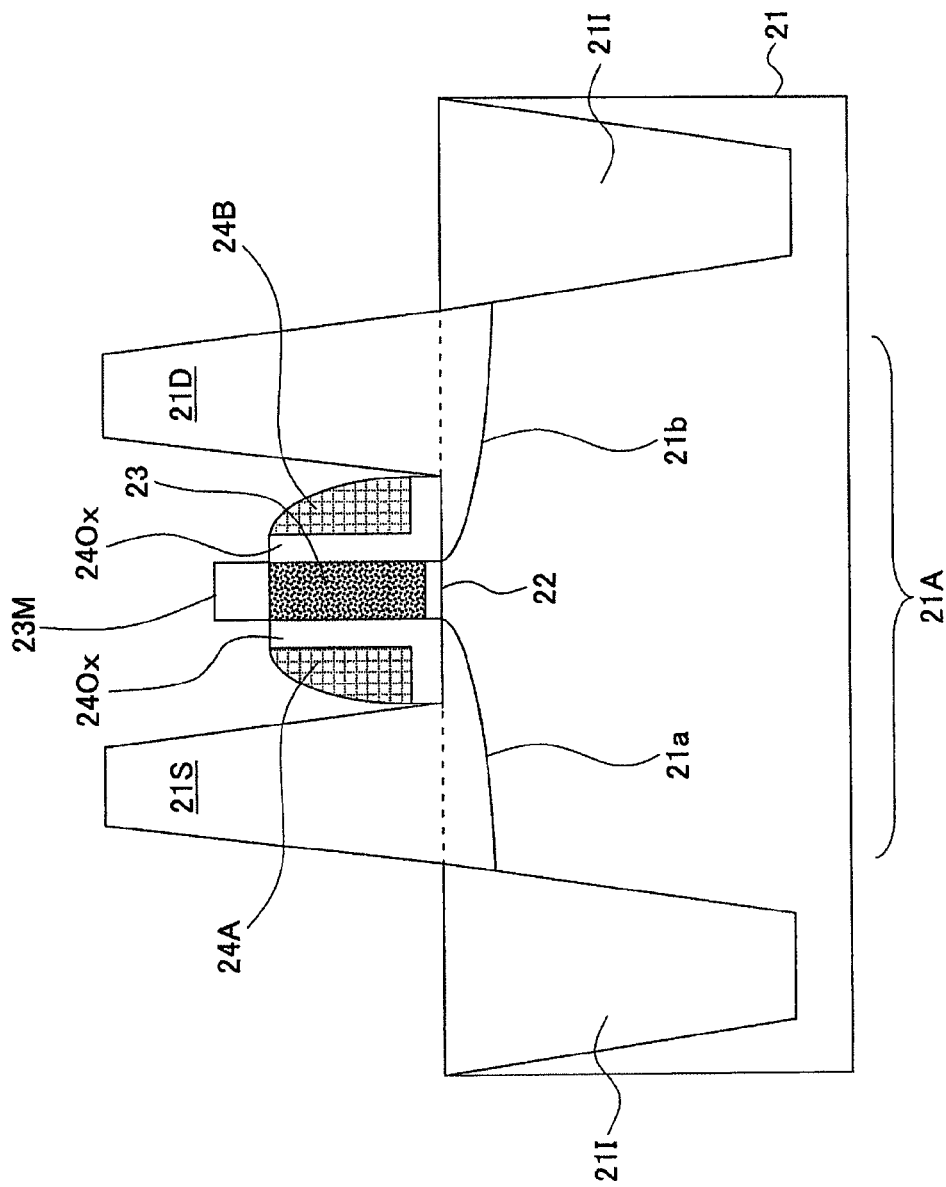
FIG. 4C is a diagram illustrating a subsequent process step continued from the process step of FIG. 4B for fabricating the p-channel MOS transistor of FIG. 3.

Then, in the process step of FIG. 4C, the structure shown in FIG. 4B is introduced into a low-pressure CVD apparatus at which the substrate temperature is set to 400-550° C., and silane ($SiH_4$) gas is supplied at a partial pressure of 1-10 Pa along with hydrogen chloride (HCl) gas supplied at a partial pressure of 1-10 Pa so that the Si epitaxial layers 21S and 21D having heights exceeding that of the gate electrode 23 (typically 40-150 nm) are epitaxially grown on the silicon substrate 21 at the outer sides of the sidewall insulating films 24A and 24B within the device region 21A. In this process, diborane ($B_2H_6$) gas is introduced into the Si epitaxial layers 21S and 21D at a partial pressure of $1\times10^{-4}$-$1\times10^{-2}$ Pa so that the Si epitaxial layers 21S and 21D may become p$^+$-type doped regions.

Then, in the process step of FIG. 4D, the silicon oxide film hard mask pattern 23M is removed and a salicide process is performed to form the silicide layers 21s and 21d on the Si epitaxial layers 21S and 21D, respectively, and the silicide layer 21g on the polysilicon electrode 23.

Then, a plasma CVD process is performed to deposit the SiN film 25 on the structure shown in FIG. 4D at a film thickness of 30-100 nm so that the SiN film 25 may store a tensile stress of 0.4-4.0 GPa, for example. In this way, the structure as is shown in FIG. 3 may be created.

According to the present embodiment, only the gate electrode 23 has to be masked by the hard mask pattern 23M upon selectively growing the Si epitaxial layers 21S and 21D on the desired outer side regions of the sidewall insulating films 24A and 24B. Also, in the case where an n-channel MOS transistor is formed on the silicon substrate 21, the n-channel MOS transistor may simply be covered by a mask pattern made of a silicon oxide film upon performing the process step of FIG. 4D.

Figure 5:
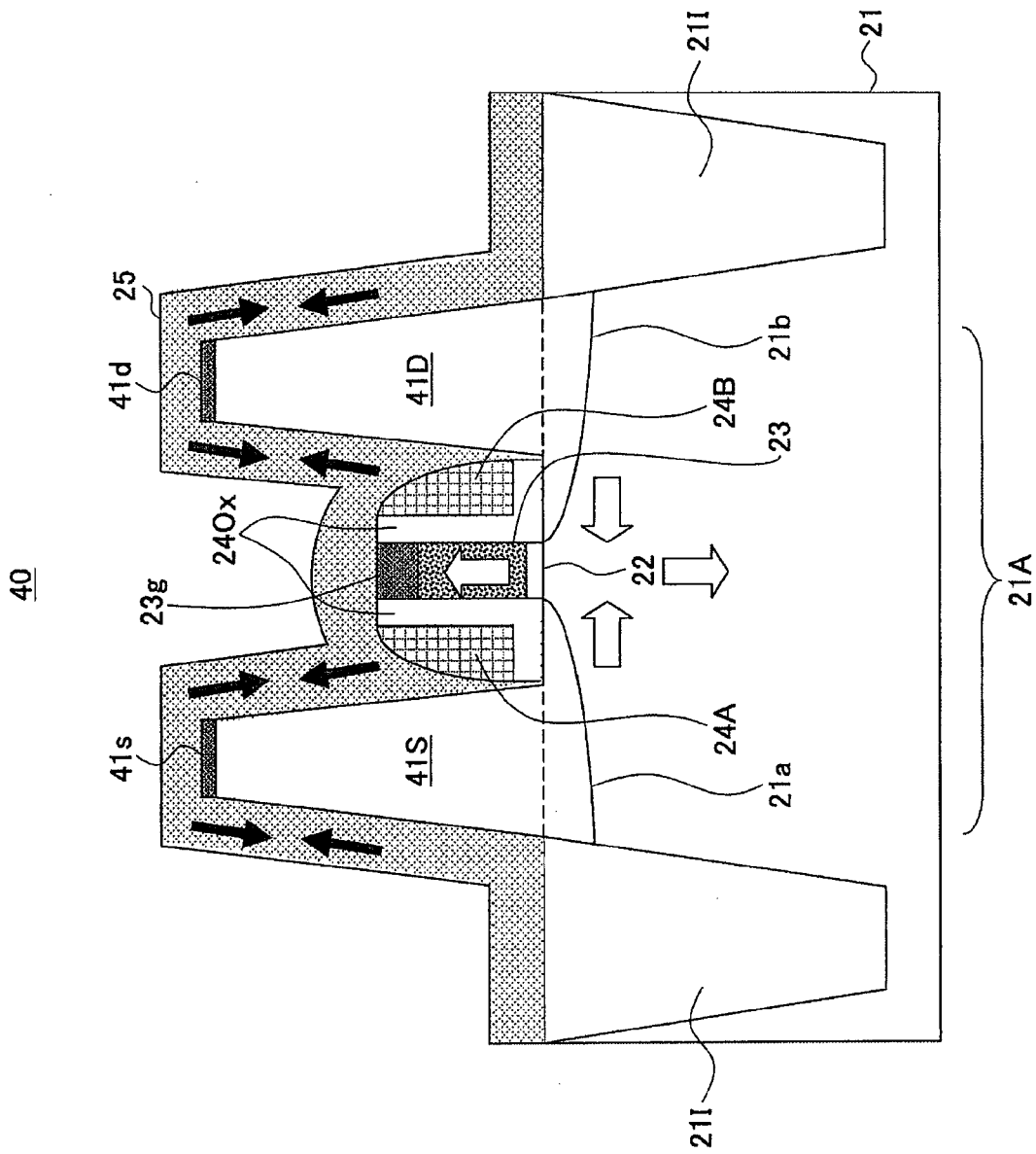
FIG. 5 is a diagram showing a configuration of a p-channel MOS transistor according to a modified embodiment of the first embodiment.

FIG. 5 is a diagram showing a configuration of a p-channel MOS transistor 40 according to a modified embodiment of the first embodiment shown in FIG. 3. It is noted that in FIG. 5, elements that are identical to those shown in FIG. 3 are given the same reference numbers and their descriptions are omitted.

In the modified embodiment of FIG. 5, silicon-germanium (SiGe) mixed crystal layers 41S and 41D including germanium (Ge) at a concentration of 0-20 atomic % are epitaxially grown on the silicon substrate 21 instead of the Si epitaxial layers 21S and 21D of the first embodiment.

The SiGe mixed crystal layers 41S and 41D are epitaxially grown on the silicon substrate 21 by supplying $GeH_4$ gas at a partial pressure of 0.1-10 Pa in the process shown in FIG. 4C.

Second Embodiment

Figure 6:
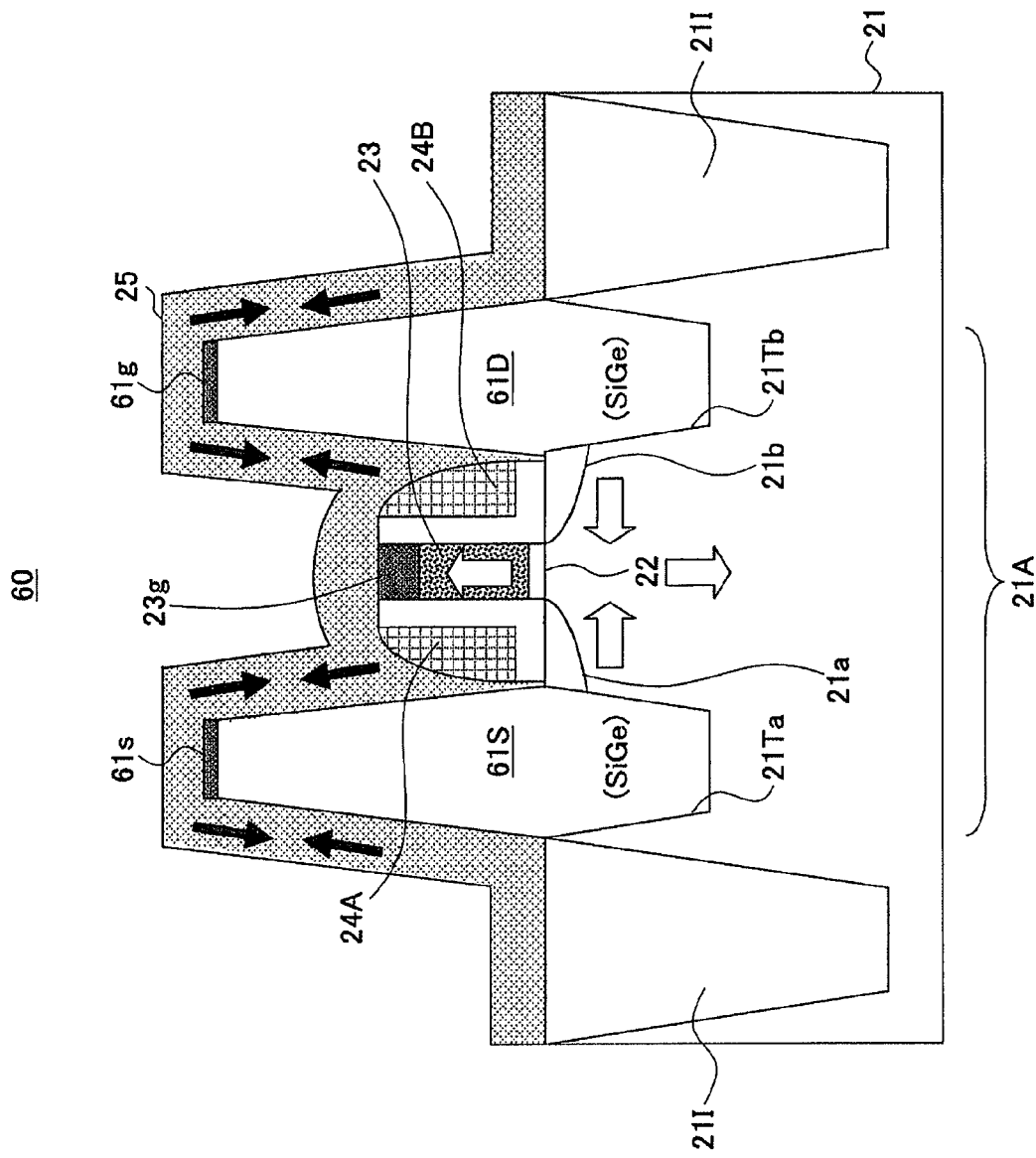
FIG. 6 is a diagram showing a configuration of a p-channel MOS transistor according to a second embodiment of the present invention.

FIG. 6 is a diagram showing a configuration of a p-channel MOS transistor 60 according to a second embodiment of the present invention. It is noted that elements of the second embodiment that are identical to those of the first embodiment are given the same reference numbers and their descriptions are omitted.

In the second embodiment shown in FIG. 6, trench portions 21Ta and 21Tb having sidewall faces and bottom faces defined by Si crystal faces are created on the silicon substrate 21 at the outer side of the sidewall insulating films 24A and 24B, and p$^+$-type SiGe mixed crystal regions 61S and 61D including Ge at a concentration of 0-20 atomic % are epitaxially grown to fill the trench portions 21Ta and 21Tb. Also, in the second embodiment shown in FIG. 6, silicide layers 61s and 61d are formed on the top portions of the SiGe mixed crystal regions 61S and 61D, respectively.

Then, the SiN film 25 that stores tensile stress is arranged on the silicon substrate 21 to continuously extend over the SiGe mixed crystal regions 61S, 61D, and the sidewall insulating films 24A and 24B in the manner described above.

In the structure according to the present embodiment, the SiGe mixed crystal regions 61S and 61D may be strained in perpendicular directions with respect to the silicon substrate 21 due to their lattice constant differences with respect to the Si crystal making up the silicon substrate 21. In turn, the Si crystal of the silicon substrate 21 located at the channel region right below the gate electrode 23 may also be strained and urged in the upward direction.

Figure 1A:
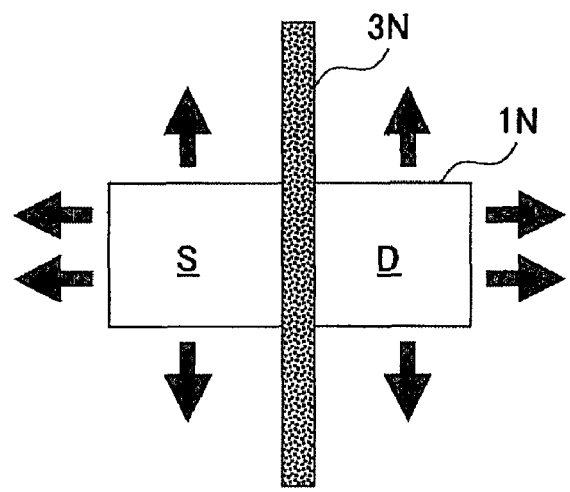
FIG. 1A is a diagram illustrating a principle of a strained n-channel MOS transistor.
Figure 1B:
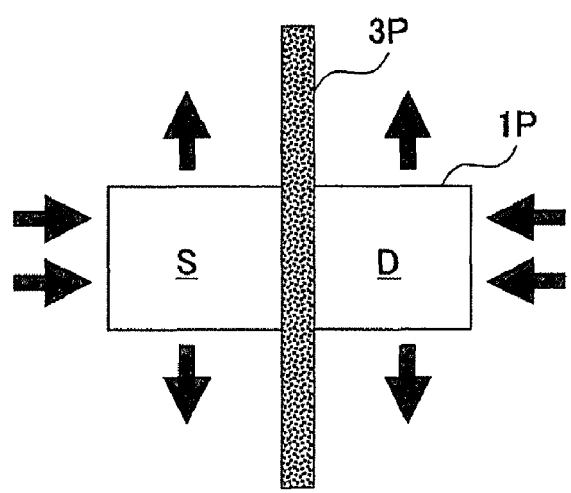
FIG. 1B is a diagram illustrating a principle of a strained p-channel MOS transistor.

It is noted that the strain applied to the Si crystal within the channel region is substantially equivalent to the compression stress in the gate length directions shown in FIG. 1B. In this way, hole mobility may be improved at the channel region right below the gate electrode 23 in the p-channel MOS transistor 60 according to the second embodiment.

Also, in the p-channel MOS transistor 60 shown in FIG. 6, the tensile stress of the tensile stress film 25 acts to pull the channel region in an upward direction toward the gate electrode 23 via the sidewall insulating films 24A and 24B. In this way, hole mobility at the channel region may be further improved.

Figure 7B:
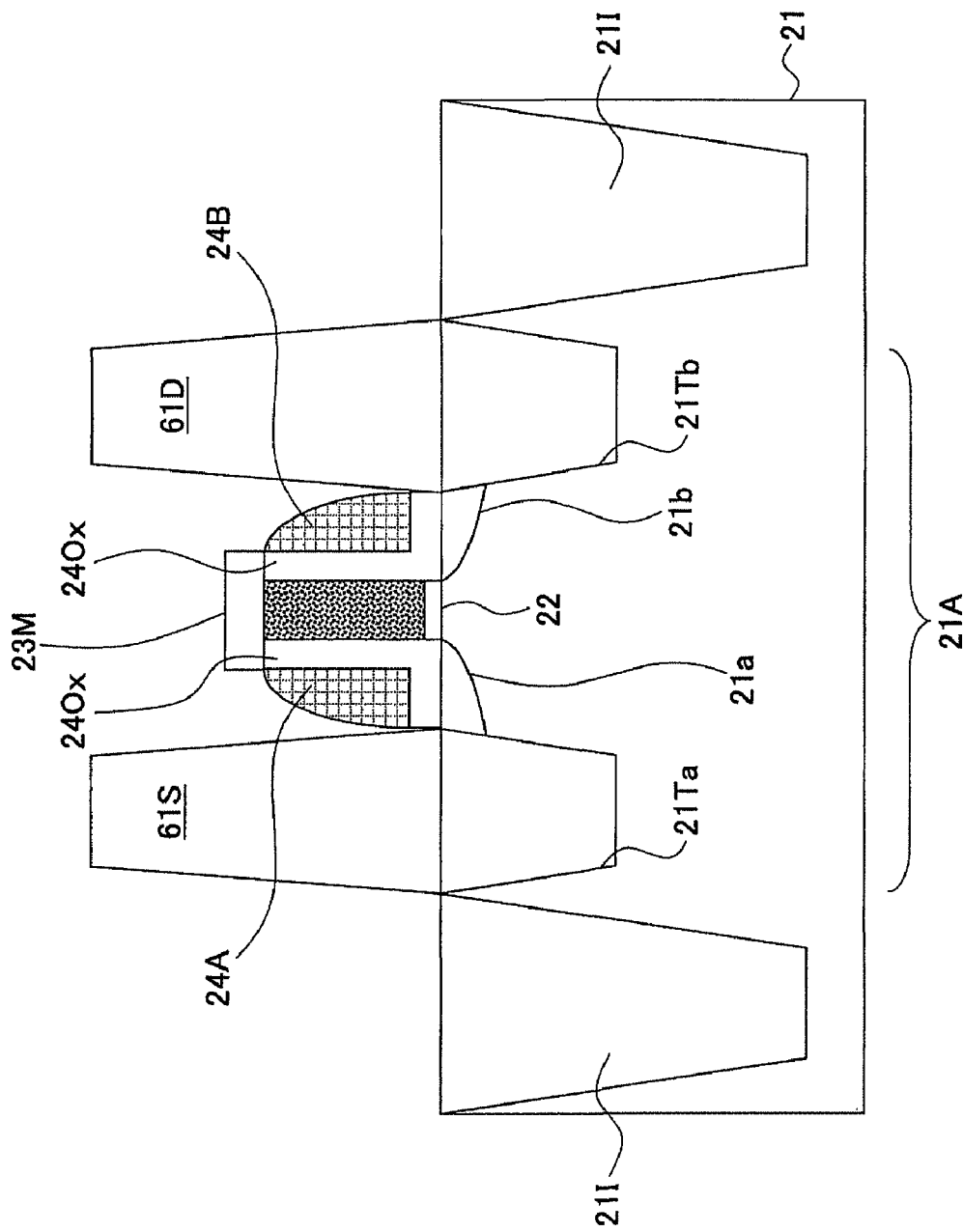
FIG. 7B is a diagram illustrating a subsequent process step continued from the process step of FIG. 7A for fabricating the p-channel MOS transistor of FIG. 6.

FIGS. 7A and 7B are diagrams illustrating process steps for fabricating the p-channel MOS transistor 60 shown in FIG. 6.

In the process step shown in FIG. 7A, the trench portions 21Ta and 21Tb are formed on the silicon substrate 21 at the outer sides of the sidewall insulating films 24A and 24B using both dry etching and wet etching. In the example shown in FIG. 7A, the sidewall faces and the bottom faces of the trench portions 21Ta and 21Tb are defined by Si crystal faces. The opposing sidewall faces of the trench portion 21Ta and 21Tb are arranged to be inclined with respect to each other such that the distance between the trench portions 21Ta and 21Tb toward the bottom side of the silicon substrate 21 is greater than the distance between the trench portions 21Ta and 21Tb toward the interface of the silicon substrate 21 with the gate insulating film 22.

Also, in the process shown in FIG. 7A, an etching mask pattern 23M made of a silicon oxide film is formed on the gate electrode 23.

Then, in the process step shown in FIG. 7B, the SiGe mixed crystal regions 61S and 61D are arranged to fill the trench portions 21Ta and 21Tb through a low-pressure CVD process that is performed using silane gas and germanic gas as source gases and using $B_2H_6$ gas as a dopant gas.

Specifically, in the low-pressure CVD process performed in the example illustrated in FIG. 7B, silane ($SiH_4$) gas and germanic ($GeH_4$) gas are each supplied at a partial pressure of 1-10 Pa under a substrate temperature of 400-550° C. along with hydrogen chloride (HCl) gas supplied at a partial pressure of 1-10 Pa and diborane ($B_2H_6$) gas supplied at a partial pressure of $1\times10^{-4}$-$1\times10^{-2}$ Pa.

Then, after removing the silicon oxide film mask pattern 23M through etching, silicide regions 61s, 61d, and 23g are formed on the SiGe mixed crystal regions 61S, 61D, and the gate electrode 23, respectively, after which the SiN tensile stress film 25 is formed over the resulting structure through a plasma CVD process to create the structure shown in FIG. 6.

Third Embodiment

Figure 8:
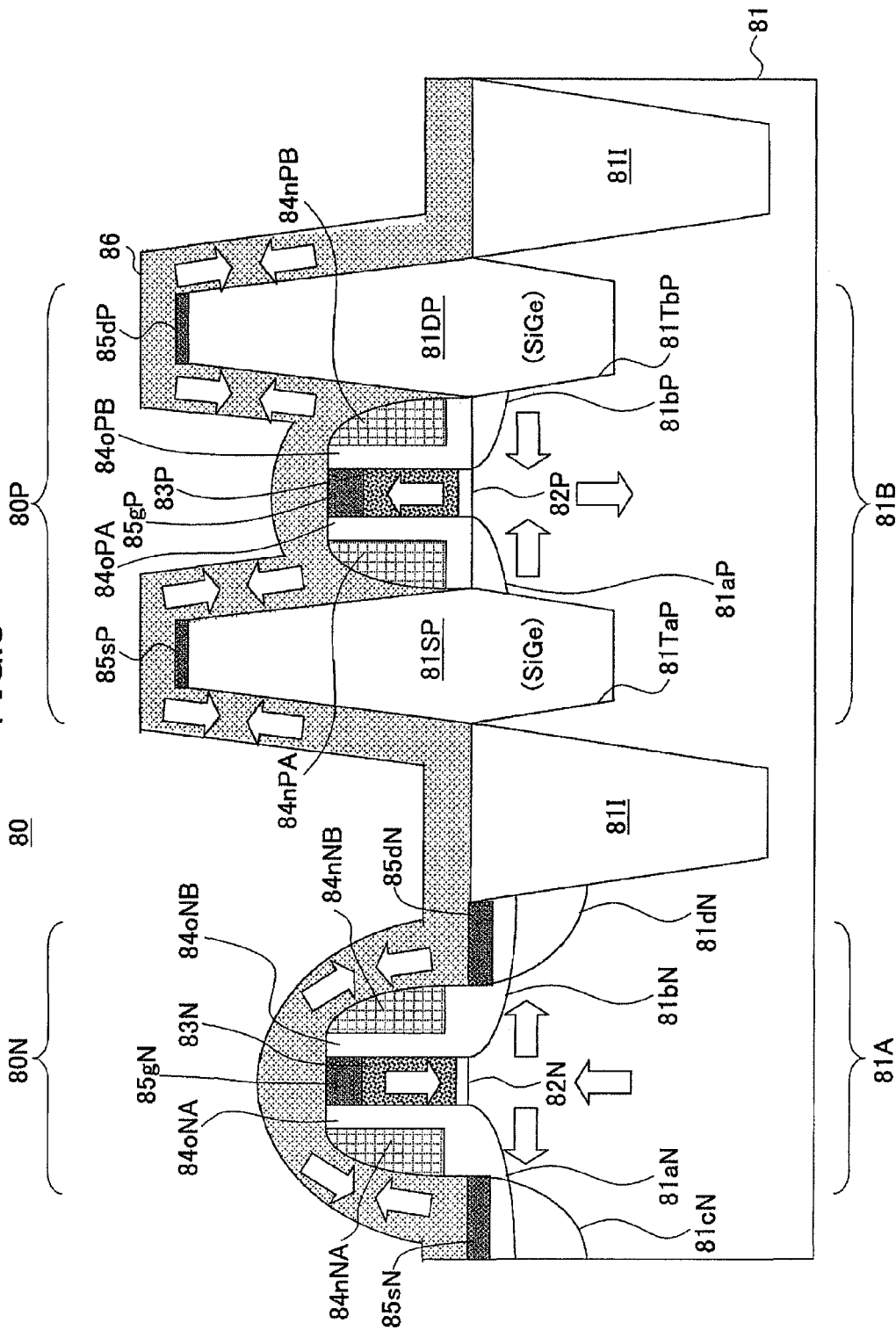
FIG. 8 is a diagram showing a configuration of a semiconductor integrated circuit device according to a third embodiment of the present invention.

FIG. 8 is a diagram showing a configuration of a semiconductor integrated circuit device 80 according to a third embodiment of the present invention.

As is shown in FIG. 8, the semiconductor integrated circuit device 80 is fabricated on a silicon substrate 81 having device regions 81A and 81B that are defined by STI device isolation regions 81I. Specifically, an n-channel MOS transistor 80N including a gate electrode 83N made of $n^+$-type polysilicon is fabricated at the device region 81A, and a p-channel MOS transistor 80P including a gate electrode 83P made of $p^+$-type polysilicon is fabricated at the device region 81B.

At the device region 81A, the gate electrode 83N is formed on the silicon substrate 81 via a gate insulating film 82N that is made up of a SiON film, and an n-type source extension region 81aN and an n-type drain extension region 81bN are formed at first and second sides of the gate electrode 83N within the silicon substrate 81.

Also, sidewall insulating films 84nNA and 84nNB are formed on the sidewall faces of the gate electrode 83N via sidewall oxide films 84oNA and 84oNB, and an $n^+$-type source diffusion region 81cN and an $n^+$-type drain diffusion region 81dN are respectively formed at the outer sides of the sidewall insulating films 84nNA and 84nNB within the silicon substrate 81.

Further, a silicide layer 85gN is formed on the polysilicon electrode 83N, and silicide layers 85sN and 85dN are formed on the source diffusion region 81cN and the drain diffusion region 81dN, respectively.

At the device region 81B, the gate electrode 83P is formed on the silicon substrate 81 via a gate insulating film 82P that is made of a SiON film, and a p-type source extension region 81aP and a p-type drain extension region 81bP are formed at first and second sides of the gate electrode 83P within the silicon substrate 81.

Also, sidewall insulating films 84nPA and 84nPB that are made of SiN are formed on the sidewall faces of the gate electrode 83P via sidewall oxide films 84oPA and 84oPB.

Further, trench portions 81TaP and 81TbP corresponding to the trench portions 21Ta and 21Tb of the second embodiment are formed at the outer sides of the sidewall insulating films 84nPA and 84nPB within the silicon substrate 81. The trench portions 81Ta and 81Tb are filled by epitaxial regions 81SP and 81DP that are made of SiGe mixed crystal doped with a $p^+$-type dopant. The epitaxial regions 81SP and 81DP are arranged to be higher than the gate electrode 83P, preferably at least twice as high as the gate electrode 83P. It is noted that the epitaxial regions 81SP and 81DP respectively correspond to a source region and a drain region of the p-channel MOS transistor 80B.

Also, a silicide layer 85gP is formed on the polysilicon electrode 83P, and silicide layers 85sP and 85dP are formed on the epitaxial source region 81SP and the epitaxial drain region 81DP, respectively.

In the present embodiment, a tensile stress film 86 corresponding to a SiN film that stores a tensile stress of 0.4-4.0 GPa is continuously arranged over the silicon substrate 81 of the semiconductor integrated circuit device 80 to cover the device regions 81A, 81B, and the device isolation regions 81I.

Specifically, at the device region 81A, the tensile stress film 86 is arranged to cover the gate electrode 83N via the sidewall insulating films 84nNA and 84nNB; and at the device region 81B, the tensile stress film 86 is arranged to cover the source region 81SP and the drain region 81DP in addition to covering the gate electrode 83P via the sidewall insulating films 84nPA and 84nPB. The tensile stress film 86 is arranged to have a film thickness of 30-100 nm, for example.

At the device region 81A, the tensile stress of the tensile stress film 86 acts to push the gate electrode 83N toward the silicon substrate 81 in a perpendicular direction with respect to the substrate surface to thereby induce strain at the channel region of the n-channel MOS transistor 80N which strain is substantially equivalent to the strain induced when tensile stress is applied in the gate length directions parallel to the substrate surface as is shown in FIG. 1A.

At the device region 81B, the tensile stress of the tensile stress film 86 acts to pull the gate electrode 83P away from the silicon substrate 81 in a perpendicular direction with respect to the substrate surface to thereby induce strain at the channel region of the p-channel MOS transistor 80P which strain is substantially equivalent to the strain induced when uniaxial compression stress is applied in the gate length directions parallel to the substrate surface as is shown in FIG. 1B.

As can be appreciated from the above descriptions, in a semiconductor integrated circuit device having an n-channel MOS transistor and a p-channel MOS transistor arranged on a common substrate according to the present embodiment, a single tensile stress film may be used to induce desired strain at each of the channel regions of the n-channel MOS transistor and the p-channel MOS transistor so that processes for manufacturing the semiconductor integrated circuit device may be simplified, for example.

Fourth Embodiment

Figure 9:
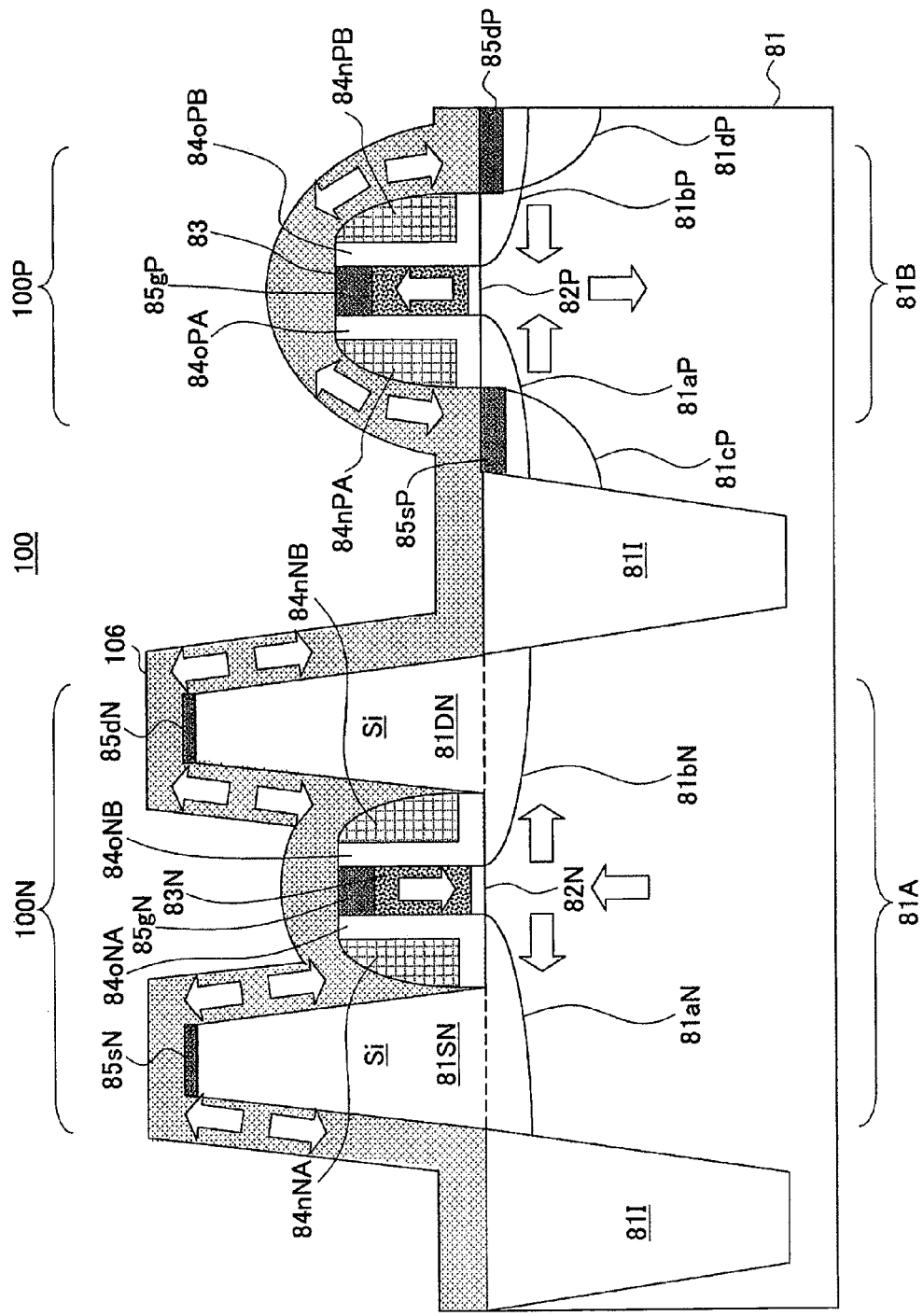
FIG. 9 is a diagram showing a configuration of a semiconductor integrated circuit device according to a fourth embodiment of the present invention.

FIG. 9 is a diagram showing a configuration of a semiconductor integrated circuit device 100 according to a fourth embodiment of the present invention. It is noted that elements shown in FIG. 9 that are identical to those shown in FIG. 8 are given the same reference numbers and their descriptions are omitted.

As is shown in FIG. 9, the semiconductor integrated circuit device 100 according to the fourth embodiment is formed on a silicon substrate 81 having device regions 81A and 81B that are defined by STI device isolation regions 81I. Specifically, an n-channel MOS transistor 100N including a gate electrode 83N made of $n^+$-type polysilicon is fabricated at the device region 81A, and a p-channel MOS transistor 100P including a gate electrode 83P made of $p^+$-type polysilicon is fabricated at the device region 81B.

At the device region 81A, the gate electrode 83N is formed on the silicon substrate 81 via a gate insulating film 82N that is made up of a SiON film, and an n-type source extension region 81aN and an n-type drain extension region 81bN are formed at first and second sides of the gate electrode 83N within the silicon substrate 81. Also, sidewall insulating films 84nNA and 84nNB are formed on the sidewall faces of the gate electrode 83N via sidewall oxide films 84oNA and 84oNB.

Further, Si epitaxial regions 81SN and 81DN that are doped with an $n^+$-type dopant are formed at the outer sides of the sidewall insulating films 84nNA and 84nNB within the silicon substrate 81. The Si epitaxial regions 81SN and 81DN respectively correspond to a source region and a drain region of the n-channel MOS transistor 100A and are epitaxially grown to be arranged higher than the gate electrode 83N, preferably at least twice as high as the gate electrode 83. Also, a silicide layer 85gN is formed on the polysilicon gate electrode 83N, and silicide layers 85sN and 85dN are formed on the Si epitaxial source region 81SN and the Si epitaxial drain region 81DN, respectively.

At the device region 81B, the gate electrode 83P is formed on the silicon substrate 81 via a gate insulating film 82P that is made of a SiON film, and a p-type source extension region 81aP and a p-type drain extension region 81bP are formed at first and second sides of the gate electrode 83P within the silicon substrate 81.

Also, sidewall insulating films 84nPA and 84nPB made of SiN are formed on the sidewall faces of the gate electrode 83P via sidewall oxide films 84oPA and 84oPB.

Further, a $p^+$-type source diffusion region 81c and a $p^+$-type drain diffusion region 81dP are respectively formed at the outer sides of the sidewall insulating films 84nPA and 84nPB within the silicon substrate 81.

Also, a silicide layer 85gP is formed on the polysilicon electrode 83P, and silicide layers 85sP and 85dP are formed on the source diffusion region 81cP and the drain diffusion region 81dP, respectively.

In the present embodiment, a compression stress film 106 corresponding to a SiN film that stores a compression stress of 0.4-4.0 GPa is continuously arranged over the silicon substrate 81 of the semiconductor integrated circuit device 100 to cover the device regions 81A, 81B, and the device isolation regions 81I. Specifically, at the device region 81A, the compression stress film 106 is arranged to cover the Si epitaxial source region 81SN and the Si epitaxial drain region 81DN in addition to covering the gate electrode 83N via the sidewall insulating films 84nNA and 84nNB; and at the device region 81B, the compression stress film 106 is arranged to cover the gate electrode 83P via the sidewall insulating films 84nPA and 84nPB. The compression stress film 106 is arranged to have a film thickness of 30-100 nm, for example.

At the device region 81A, the compression stress of the compression stress film 106 acts to push the gate electrode 83N toward the silicon substrate 81 in a perpendicular direction with respect to the substrate surface to thereby induce strain at the channel region of the n-channel MOS transistor 100N which strain is substantially equivalent to the strain induced when tensile stress is applied in the gate length directions parallel to the substrate surface as is shown in FIG. 1A.

At the device region 81B, the compression stress of the compression stress film 106 acts to pull the gate electrode 83P away from the silicon substrate 81 in a perpendicular direction with respect to the substrate surface to thereby induce strain at the channel region of the p-channel MOS transistor 100P which strain is substantially equivalent to the strain induced when uniaxial compression stress is applied in the gate length directions parallel to the substrate surface as is shown in FIG. 1B.

As can be appreciated from the above descriptions, in a semiconductor integrated circuit device having an n-channel MOS transistor and a p-channel MOS transistor arranged on a common substrate according to the present embodiment, a single compression stress film may be used to induce desired strain at each of the channel regions of the n-channel MOS transistor and the p-channel MOS transistor so that processes for manufacturing the semiconductor integrated circuit device may be simplified, for example.

In the following, exemplary advantageous effects achieved by embodiments of the present invention are described.

According to one aspect of the present invention, a tensile stress film having tensile stress may be used to induce uniaxial compression stress acting in the gate length directions at the channel region of a p-channel MOS transistor so that hole mobility may be improved at the channel region of the p-channel MOS transistor, for example.

According to another aspect of the present invention, in a semiconductor integrated circuit device, such as a CMOS device, that has a p-channel MOS transistor and an n-channel MOS transistor arranged on a common substrate, a single stress film may be used to induce desired stress at each of the channel regions of the p-channel MOS transistor and the n-channel MOS transistor so that hole mobility may be improved at the channel region of the p-channel MOS transistor and electron mobility may be improved at the channel region of the n-channel MOS transistor, for example.

Although the present invention has been described above with respect to certain preferred embodiments, the present invention is not limited to these specific embodiments, and variations and modifications may be made without departing from the scope of the present invention.

What is claimed is:

1. A p-channel MOS transistor comprising:
a silicon substrate;
a gate electrode formed on the silicon substrate via a gate insulating film;
a channel region formed below the gate electrode within the silicon substrate;
a p-type source region and a p-type drain region that are formed at opposite sides of the channel region within the silicon substrate;
a first sidewall insulating film and a second sidewall insulating film that are formed on opposing sidewall faces of the gate electrode;
a first p-type epitaxial region and a second p-type epitaxial region that are respectively formed at outer sides of the first sidewall insulating film and the second sidewall insulating film on the silicon substrate the first p-type epitaxial region and the second p-type epitaxial region being arranged to have heights larger than a height of the gate electrode; and
a tensile stress film that stores tensile stress and is arranged to cover the gate electrode via the first sidewall insulating film and the second sidewall insulating film, said tensile stress film being arranged to continuously cover the gate electrode, the first and second sidewall insulating films, the first and second p-type epitaxial regions, and depression regions between the first sidewall insulating film and the first p-type epitaxial region and between the second sidewall insulating film and the second p-type epitaxial region,
wherein a bottom of said tensile stress film on the gate electrode is lower than bottoms of said tensile stress film on the first and the second p-type epitaxial regions.

2. The p-channel MOS transistor as claimed in claim 1, wherein
the first p-type epitaxial region and the second p-type epitaxial region are made of silicon.

3. The p-channel MOS transistor as claimed in claim 1, wherein
the first p-type epitaxial region and the second p-type epitaxial region are made of silicon-germanium mixed crystal.

4. The p-channel MOS transistor as claimed in claim 3, wherein
a first concave portion and a second concave portion are respectively formed at outer sides of the first sidewall insulating film and the second sidewall insulating film within the silicon substrate; and the first p-type epitaxial region and the second p-type epitaxial region are respectively arranged to grow in a perpendicular direction with respect to the silicon substrate from the first concave portion and the second concave portion.

5. The p-channel MOS transistor as claimed in claim 4, wherein
the first concave portion and the second concave portion have opposing sidewall faces that are defined by crystal faces; and
the opposing sidewall faces of the first concave portion and the second concave portion are inclined with respect to each other such that a distance between the first concave portion and the second concave portion toward a bottom side of the silicon substrate is greater than a distance between the first concave portion and the second concave portion toward an interface of the silicon substrate with the gate insulating film.

6. The p-channel MOS transistor as claimed in claim 1, wherein
the tensile stress film is a silicon nitride film that stores a tensile stress of 0.4-4.0 GPa.

* * * * *